US006358379B1

(12) United States Patent
Kouchiyama

(10) Patent No.: US 6,358,379 B1
(45) Date of Patent: Mar. 19, 2002

(54) METHOD OF FORMING A MAGNETO-RESISTANCE EFFECT THIN FILM

(75) Inventor: Akira Kouchiyama, Kanagawa (JP)

(73) Assignee: Sony Corporation, Tokyo (JP)

( * ) Notice: Subject to any disclaimer, the term of this patent is extended or adjusted under 35 U.S.C. 154(b) by 1544 days.

(21) Appl. No.: 08/536,045

(22) Filed: Sep. 29, 1995

Related U.S. Application Data

(63) Continuation of application No. 08/258,589, filed on Jan. 10, 1994, now abandoned.

(30) Foreign Application Priority Data

Jun. 11, 1993 (JP) ........................................ 5-140732

(51) Int. Cl.[7] ........................................ C23C 14/34
(52) U.S. Cl. ................................ 204/192.2; 204/192.15
(58) Field of Search ......................... 204/192.15, 192.2, 204/298.11

(56) References Cited

U.S. PATENT DOCUMENTS 4,260,466 A * 4/1981 Shirahata et al. .... 204/192.2 X
4,576,699 A * 3/1986 Sato et al. ........... 204/192.2 X
4,824,724 A * 4/1989 Ueda et al. .......... 204/192.2 X
4,929,320 A * 5/1990 Yamada et al. .......... 204/192.2
4,940,511 A * 7/1990 Fontana, Jr. et al. .......... 216/22
5,505,834 A * 4/1996 Chaug et al. ............. 216/22 X

* cited by examiner

*Primary Examiner*—Nam Nguyen
(74) *Attorney, Agent, or Firm*—Sonnenschein, Nath & Rosenthal

(57) ABSTRACT

According to the present invention, there is provided a method of forming a magneto-resistance thin film in which a single unit layer of an Ni—Fe alloy thin film layer or a superlattice thin film layer of Ni and Fe is formed as a unit layer or a plurality of the unit layers are laminated by sputtering Ni and Fe on a base material from an Ni target and an Fe target disposed separately while the Ni target and the Fe target are both being rotated relatively to the base material. Further, according to the present invention, the unit layer has a thickness of 10 Å of smaller. Furthermore, according to the present invention, an amount of Ni in a composition of the whole of the magneto-resistance film formed of the Ni-Fe alloy thin film layer or the superlattice thin film layer of Ni and Fe is selected in a range of from 75 to 90 weight %. The present invention is to provide a method of forming an MR film in which an MR film of high magneto-resistance changing ratio and which has a small thickness can reliably and stably be obtained with excellent reproducibility and with high productivity.

14 Claims, 5 Drawing Sheets

METHOD OF FORMING A MAGNETO-RESISTANCE EFFECT THIN FILM

This is a continuation, of application Ser. No. 08/258,589, filed Jun. 10, 1994 abandoned.

BACKGROUND OF THE INVENTION

The present invention relates to a method of forming a magneto-resistance effect film (MR film) used in a magneto-resistance effect (MR) type magnetic head, for example.

It is customary that an MR film forming an MR type magnetic head or the like is formed of an Ni—Fe alloy film.

Also, it is customary that, when the MR film is formed of the Ni—Fe alloy, the MR film is formed by the application of vacuum evaporation or sputtering using the Ni—Fe alloy as an evaporation source or a target These vacuum evaporation and sputtering, however, have disadvantages in forming a film. Specifically, it is difficult for the vacuum evaporation to control a film thickness of the MR film. Therefore, the vacuum evaporation is not suitable for reducing a film thickness of the MT film. The sputtering, on the other hand, has the problem that a magneto-resistance changing ratio thereof is small as compared with that of the vacuum evaporation.

The Ni—Fe alloy film is fundamentally small in magneto-resistance changing ratio. Specifically, a magneto-resistance changing ratio obtained under restrictions that the Ni—Fe alloy film is actually applied to a magnetic head is 2% at maximum. In general, a magneto-resistance changing ratio of the Ni—Fe alloy film falls in a range of about 1.5 to 1.6%.

FIG. 1 of the accompanying drawings schematically shows a front view of a magnetic gap portion of an MR type magnetic head which carries out magnetic recording and reproduction. As shown in FIG. 1, when an MR element 3 forming an MR type reproducing head is disposed within a magnetic gap G formed in recording magnetic head cores/magnetic shield cores 2 in an opposing relation to a magnetic recording medium 1, the magnetic gap G is requested to be reduced in width in order to enhance a recording density. Therefore, it is requested that the MR element, i.e., the MR film is reduced in thickness much more. If however the MR film is reduced in thickness as described above, then the magneto-resistance changing ratio is lowered much more, which causes a trouble in actual practice.

SUMMARY OF THE INVENTION

It is an object of the present invention to provide a method of forming a magneto-resistance effect thin film (MR film) in which the MR film of a high magneto-resistance changing ratio and of a small film thickness can reliably and stably be obtained with excellent reproducibility and with high productivity.

According to the present invention, there is provided a method of forming a magneto-resistance effect thin film in which a single unit layer of an Ni—Fe alloy thin film layer or superlattice thin film layer of Ni and Fe is formed as a unit layer or a plurality of said unit layers are laminated by sputtering Ni and Fe on a base material from an Ni target and an Fe target disposed separately while the Ni target and the Fe target are both being rotated relatively to the base material.

Further, according to the present invention, the unit layer has a thickness of 10 Å or smaller.

Furthermore, according to the present invention, an amount of Ni in a composition of the whole of the magneto-resistance film formed of the Ni—Fe alloy thin film layer or the superlattice layer of Ni and Fe is selected in a range of from 75 to 90 weight %.

DETAILED DESCRIPTION OF THE PREFERRED EMBODIMENT

Prior to the description of the present invention, specific features of the present invention will be summarized as follows.

Figure 2:
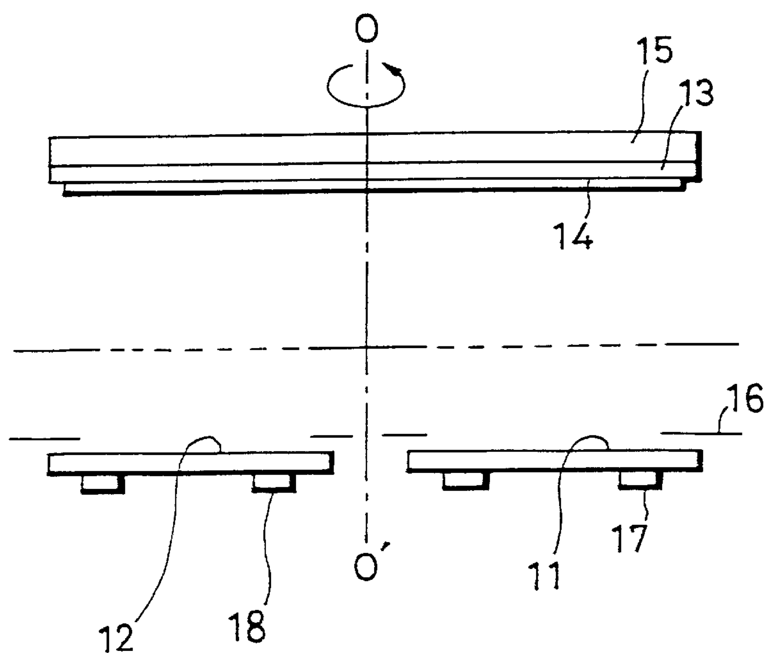
FIG. 2 is a schematic diagram showing an example of a sputtering apparatus used in a method according to the present invention.

According to the present invention, as shown in a schematic diagram of FIG. 2 which shows a sputtering apparatus used in the present invention, Ni and Fe are respectively sputtered on a base material 13 from an Ni target 11 and an Fe target 12 disposed separately while the Ni target 11 and the Fe target 12 are being rotated relatively to the base material 13, thereby forming an MR layer 14 in which a single unit layer of an Ni—Fe alloy thin film layer or a superlattice thin film layer of Ni and Fe is formed as a unit layer or a plurality of the unit layers are laminated.

According to the method of the present invention, a thickness of the unit layer formed of the Ni—Fe alloy thin film layer or the superlattice thin film layer of Ni and Fe is selected to be 10 Å or smaller. Specifically, when the MR film 14 is formed of the single layer of the Ni—Fe alloy film, the film thickness of the MR film 14 is selected to that of the single layer. When the MR film 14 is formed by laminating the Ni—Fe alloy film, the thickness of the MR film 14 is selected to that of each of the laminated Ni—Fe alloy films. When the MR film 14 is formed of the superlattice thin film layer of Ni and Fe, the thickness of one cycle amount is selected to be less than 10 ÅA.

Further, according to the method of the present invention, an amount of Ni in the composition of the whole of the MR film formed of the Ni—Fe alloy film or the superlattice thin film layer of Ni and Fe, i.e., Ni amount in terms of weight ratio is selected in a range of from 75 to 90 weight % or should preferably be selected in a range of from 76 to 83.5 weight %.

Furthermore, according to the method of the present invention, there is formed the MR film 14 by sputtering Ni and Fe on the base material 13 from the Ni target 11 and the Fe target 12 disposed respectively while the Ni target 11 and the Fe target 12 are both being rotated relative to the base material 13.The MR film 14 having a small film thickness can be formed with a high magneto-resistance changing ratio. Also, when the sputtering is carried out, the base material 13 need not be heated particularly. Therefore, the MR film can reliably and stably be formed with excellent reproducibility and with high productivity.

A method according to an embodiment of the present invention will now be described. Referring initially to FIG. 2, an example of a sputtering apparatus used when the method of the present invention is carried out will be described below.

The sputtering apparatus according to the present invention may be formed as a magnetron. In this case, a table 15 which rotates about an axis O–O' is disposed within a bell jar (not shown) and the base material 13 which forms the desired MR film 14 is disposed on the lower surface of the table 15.

A pair of sputtering sources, i.e., the Ni target 11 and the Fe target 12 are disposed about the axis –O' at an equal angular interval, i.e., with an angular extent of 180° in an opposing relation to the base material 13.

Magnets 17, 18 are attached to the lower surfaces of the Ni target 11 and the Fe target 12, respectively.

Between the Ni and Fe targets 11, 12 and the table 15, i.e., the base material 13 is disposed a mask 16 which defines the sputtering positions of Ni and Fe supplied from the Ni and Fe targets 11 and 12.

Figure 3:
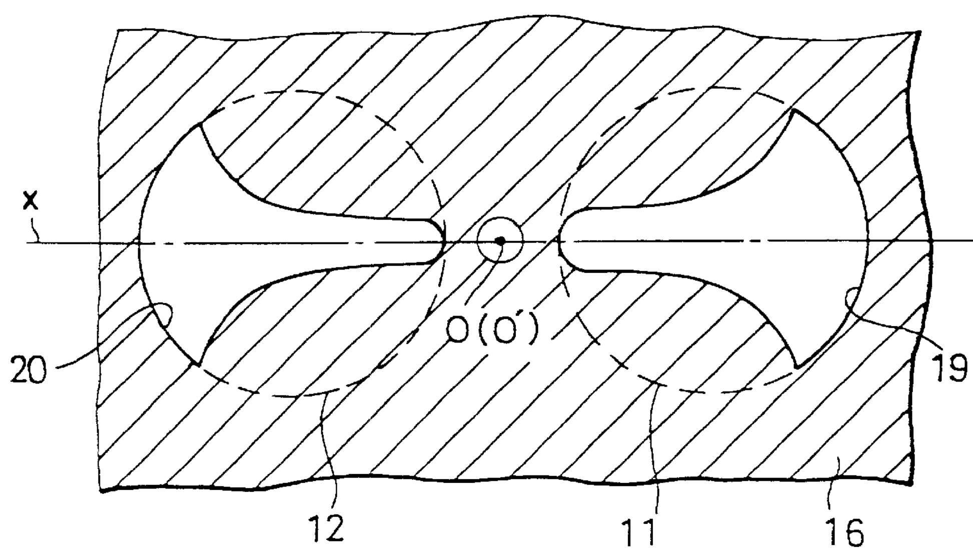
FIG. 3 is a plan view showing a main portion of the example of the sputtering apparatus.

FIG. 3 is a plan view showing an example of the mask 16. As shown in FIG. 3, the mask 16 has at its portions corresponding to the Ni and Fe targets 11, 12 arcuate windows 19, 20 which are increased their widths outwardly toward the direction of a straight line x passing the center O (O') of these Ni and Fe targets 11, 12. Under the condition that the table 15 is in the stopped condition, Ni from the Ni target 11 is sputtered mainly on one half portion of the base material 13 and Fe from the Fe target 12 is sputtered mainly on the other half portion of the base material 13.

A DC sputtering is carried out by using the Ni and Fe targets 11, 12 as the negative polarity sides while the table 15 is being rotated.

By using the above-mentioned sputtering apparatus, Ni and Fe are respectively sputtered on the base material 13 from the Ni target 11 and the Fe target 12 while the table 15 is being rotated about the axis O–O'. At that time, the base material 13 need not be heated particularly.

Figure 4:
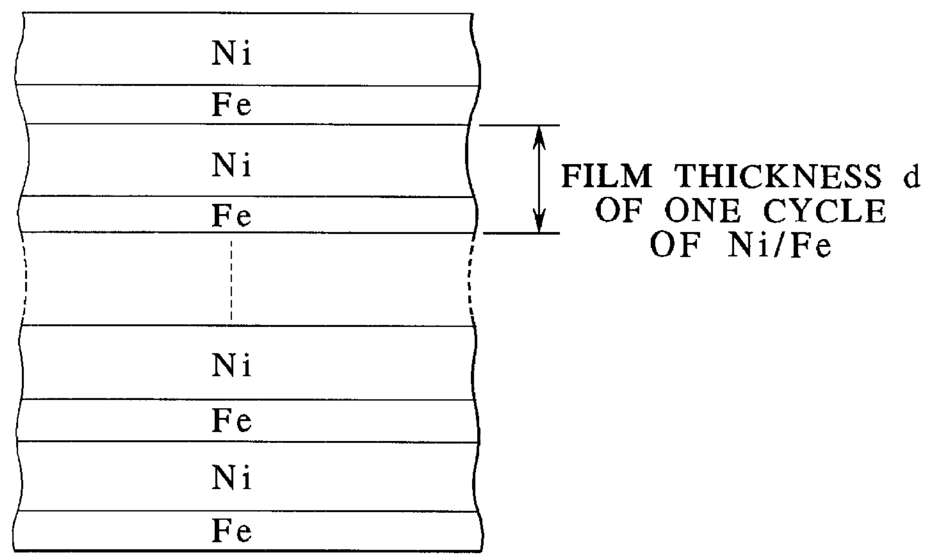
FIG. 4 is a schematic cross-sectional view of an MR film obtained by the method according to the present invention.

When the above-mentioned sputtering is carried out, by selecting a sputtering electric power, a relative rotational speed, a revolution rate, i.e., sputtering time, it is possible to form the MR film 14 in which Ni and Fe of single atomic layer or smaller, for example, are formed on the base material 13 to form a single layer of an Ni—Fe alloy unit layer or a plurality of laminated Ni—Fe alloy unit layers forming so-called Ni—Fe alloy state in which Ni and Fe are made nebulously. Alternatively, as shown in a cross-sectional view forming FIG. 4, it is possible to form the MR film 14 in which, although Ni and Fe exhibit a superlattice structure, Ni and Fe of several atomic layers or of single atomic layers form thin layers relatively clearly and which has a superlattice cycle structure formed by laminating Ni layer and Fe layer at the unit of one cycle of at least Ni and Fe layers.

In the method according to the present invention, a thickness d of the above-mentioned unit layer of the Ni—Fe alloy or superlattice thin film layer of Ni and Fe is selected to be 10 Å or smaller.

Further, in the method according to the present invention, an amount of Ni in the composition of the whole MR thin film formed of the Ni—Fe alloy or the Ni/Fe superlattice thin film layer is selected to be 75 to 90 atomic % or should preferably be selected in a range of from 76 to 83.5 weight %.

Figure 5:
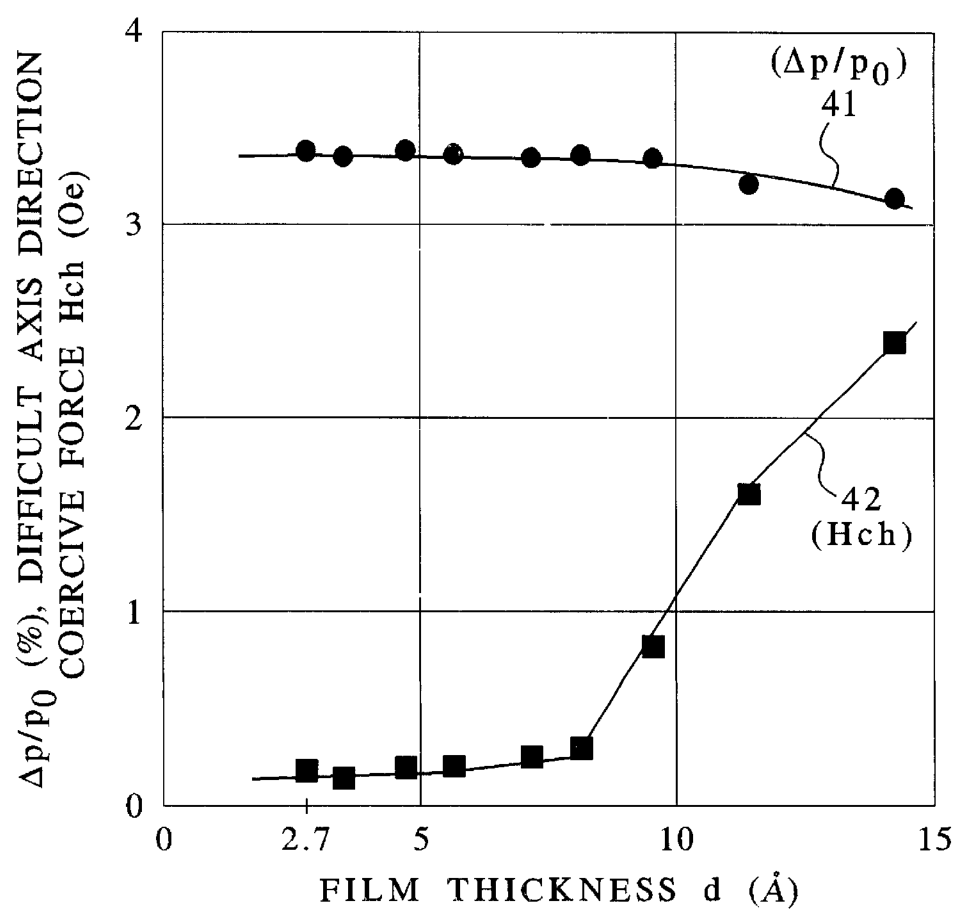
FIG. 5 is a graph showing measured results obtained when a magneto-resistance changing ratio and a coercive force relative to the change of a thickness of a unit layer of the MR film were measured.

In FIG. 5, characteristic curves 41, 42 show measured results of a magneto-resistance changing ratio $\Delta\rho/\rho_0$ and a magnetization difficult axis direction coercive force $H_{ch}$ relative to the thickness d obtained when the layer thickness d of one cycle of the Ni/Fe superlattice thin film layer was changed. Study of FIG. 5 reveals that, when the film thickness is less than 10 Å, i.e., at least 2.7Å or greater, the magneto-resistance changing ratio $\Delta\rho/\rho_0$ exhibits a large value exceeding 3% and the coercive force $H_{ch}$ of 1 (Oe) or smaller can be obtained. This is the reason that the layer thickness d is selected to be less than 10 Å according to the present invention.

Figure 6:
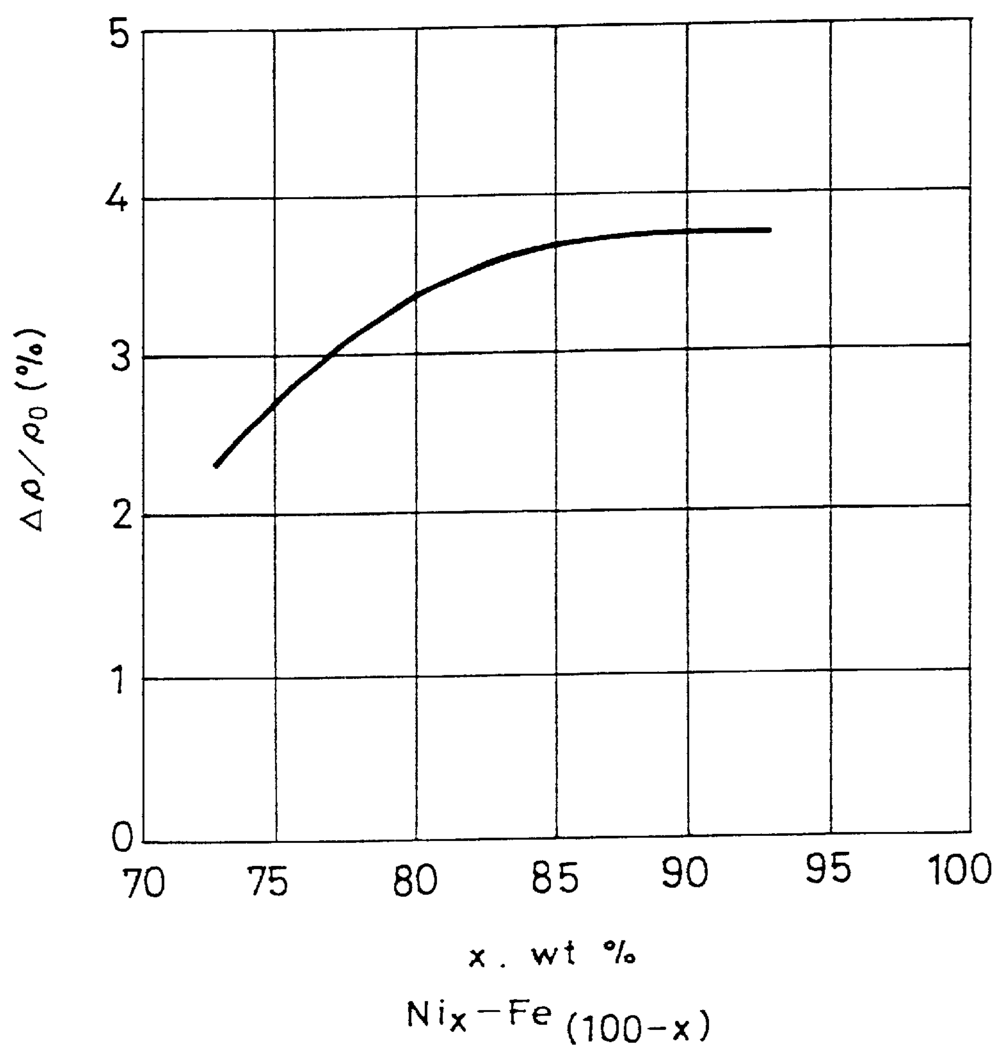
FIG. 6 is a graph showing measured results obtained when the magneto-resistance changing ratio relative to the change of a composition of the MR film according to the present invention was measured.
Figure 7:
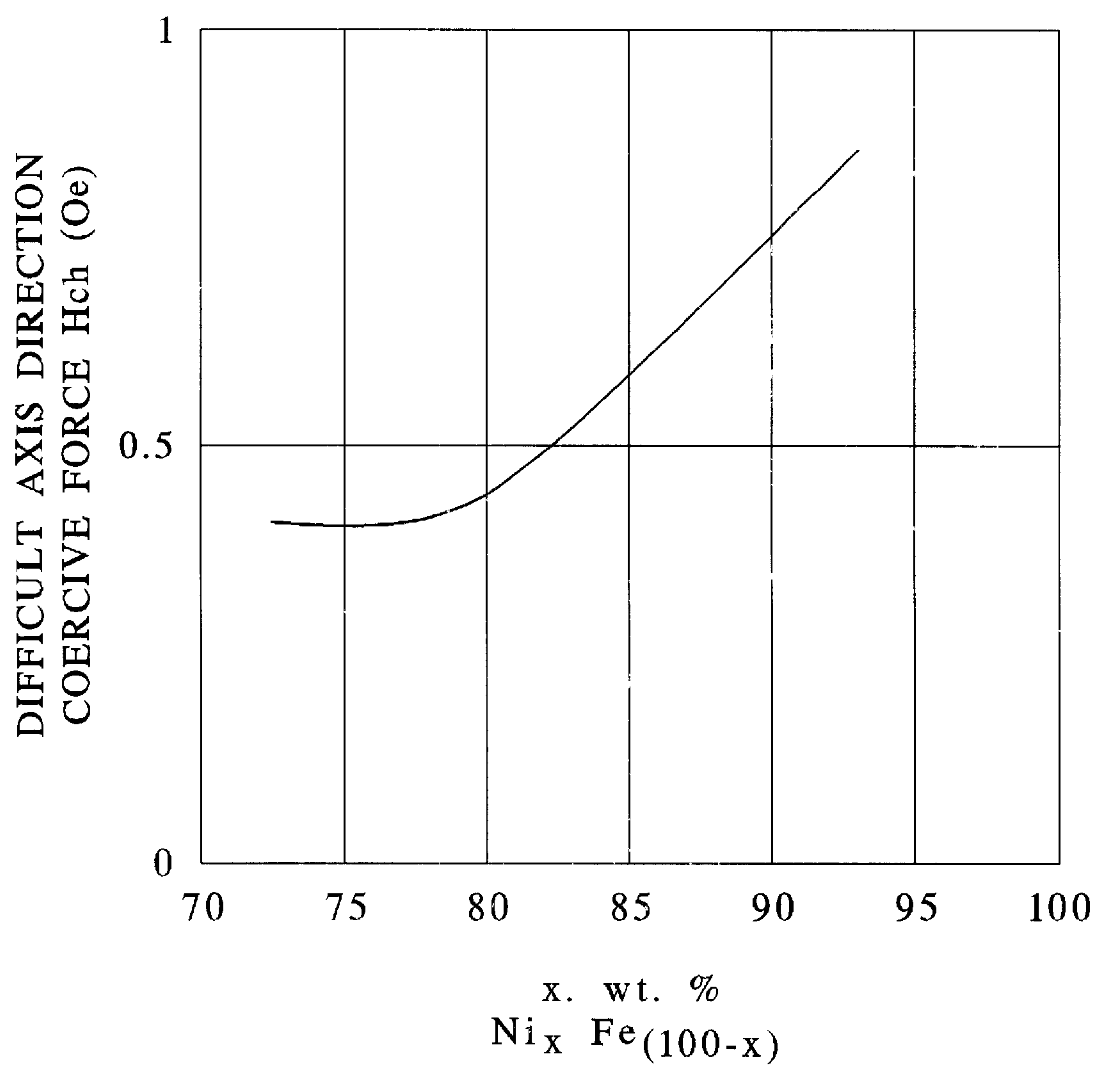
FIG. 7 is a graph showing measured results obtained when a coercive force of a magnetization difficult axis direction relative to the change of the composition of the MR film according to the present invention was measured.

FIGS. 6 and 7 show measured results of the magneto-resistance changing ratio $\Delta\rho/\rho_0$ and the magnetization difficult axis direction coercive force $H_{ch}$ obtained when a value x in a composition $Ni_x$–$Fe_{100-x}$ on the whole MR film was changed.

Study of FIGS. 6 and 7 reveals that, when the amount of Ni in the composition of the whole MR film formed of the Ni—Fe alloy or Ni/Fe superlattice thin film layer is selected in a range of from 75 to 90 weight %, the coercive force $H_{ch}$ becomes 1 (Oe) or smaller and that a high magneto-resistance changing ratio $\Delta\rho/\rho$ can be obtained. Therefore, this is the reason that the amount of Ni is selected in a range of from 75 to 90 weight % according to the present invention. However, the amount of Ni should preferably be selected to be 83.5 weight % or smaller when it is requested to lower a coercive force. Further, in order to obtain a higher magneto-resistance changing ratio $\Delta\rho/\rho$, the amount of Ni should preferably be selected to be 76 weight % or greater.

Embodiment 1

The MR film was formed by the sputtering apparatus shown in FIGS. 2 and 3. The conditions that the MR film was formed at that time were as follows:

| | |
|---|---|
| Achieved vacuum degree | $5 \times 10^{-5}$ Pa |
| Ar gas pressure | 0.1 Pa |
| Ni/Fe unit layer thickness d | 0.48 nm |
| Applied electric power | |
| (Ni target) | 762 W |
| (Fe target) | 328 W |

The magneto-resistance changing ratio $\Delta\rho/\rho$, an anisotropic magnetic field $H_k$, the magnetization difficult axis direction coercive force $H_{ch}$ and the resistivity $\rho_0$ according to the embodiment 1 were compared with those obtained according to the conventional method. Compared results are illustrated on the following table 1.

TABLE 1

| | inventive Ni-Fe film | conventional Ni-Fe film |
|---|---|---|
| $\Delta\rho/\rho_0$ (%) | 3.4 | 1.6 |
| $H_k$ (Oe) | 4 | 4 |

TABLE 1-continued

| | inventive Ni-Fe film | conventional Ni-Fe film |
|---|---|---|
| $H_{ch}$ (Oe) | 0.2 | 0.2 |
| $\rho_0$ ($\mu\Omega$cm) | 24 | 25 to 30 |

Figure 1:
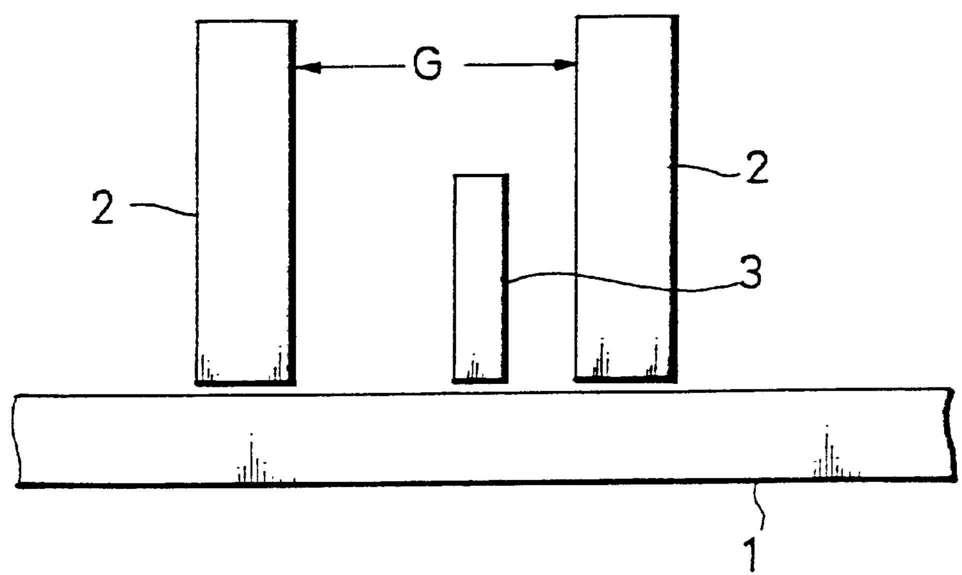
FIG. 1 is a front view schematically showing an example of an MR type magnetic head.

As is clear from the above table 1, according to the present invention, the high magneto-resistance changing ratio $\Delta\rho/\rho$ can be obtained with a coercive force of substantially the same as that of the prior art. Therefore, when the MR type magnetic head is manufactured by using the method of the present invention, a high reproduced output can be obtained as compared with that of the prior art while the film thickness is the same. Further, since the thickness of the MR film can be reduced when the level of a reproduced output is set to be substantially the same as that of the prior art, the gap G shown in FIG. 1 can be reduced in width, thereby making it possible to effect the high density recording.

As described above, according to the present invention, it is possible to form the MR film whose magneto-resistance changing ratio is high and whose thickness is thin. In the sputtering of this MR film, the base material 13 need not be heated and the arrangement of the sputtering apparatus can be simplified. Also, a working time required by sputtering can be reduced and the sputtering can be stabilized. Therefore, the MR film can reliably and stably be formed with excellent reproducibility and high productivity.

Furthermore, since the magneto-resistance changing ratio of the MR film can be increased, the sensitivity of the MR type head can be improved. Since the film thickness of the MR film can be reduced, a working time of the sputtering can be further reduced. Moreover, the recording density can be improved when the method of the present invention is applied to the magnetic head in which the MR type magnetic head is disposed in the gap G of the recording magnetic head shown in FIG. 1. Thus, the present invention can achieve many and important advantages as described above.

Having described a preferred embodiment of the invention with reference to the accompanying drawings, it is to be understood that the invention is not limited to that precise embodiment and that various changes and modifications could be effected therein by one skilled in the art without departing from the spirit or scope of the invention as defined in the appended claims.

What is claimed is:

1. A method of forming a magneto-resistance effect thin film for a magneto-resistance effect type magnetic head, in which a single unit layer of an Ni—Fe alloy thin film layer or a superlattice thin film layer of Ni and Fe is formed as a unit layer or a plurality of said unit layers are laminated, comprising the step of:

providing a base material for forming thereon a thin film for a magneto-resistance effect type magnetic head;

forming said thin film for said magneto-resistance effect type magnetic head by sputtering Ni and Fe on said base material from an Ni target and an Fe target disposed separately while said Ni target and said Fe target are both being rotated relatively to said base material.

2. The method according to claim 1, wherein said unit layer has a thickness of less than 10 Å.

3. The method according to claim 1, wherein an amount of Ni in a composition of the whole of said magneto-resistance effect thin film formed of said Ni—Fe alloy thin film layer or said superlattice layer of Ni and Fe is selected in a range of from 75 to 90 weight %.

4. A method of manufacturing a magneto-resistance effect magnetic head comprising the steps of:

providing a base material for forming thereon a thin film for a magneto-resistance type magnetic head;

forming said thin film of Ni—Fe by sputtering Ni and Fe on said base material from an Ni target and an Fe target disposed separately while said Ni target and said Fe target and said base material are relatively rotated.

5. The method according to claim 4, wherein said unit layer has a thickness of less than 10 Å.

6. The method according to claim 4, wherein an amount of Ni in a composition of said thin film is selected in a range of from 75 to 90 weight %.

7. A method of manufacturing a magneto-resistance effect magnetic head comprising the steps of:

providing a base material for forming thereon a thin film for a magneto-resistance type magnetic head;

forming said thin film of Ni—Fe by sputtering Ni and Fe on said base material from an Ni target and a Fe target disposed separately while said Ni target and said Fe target and said base material are relatively rotated; and forming a plurality of thin layers of Ni and Fe alternately.

8. The method according to claim 7, wherein an amount of Ni in the composition of the whole magneto-resistance effect thin film is selected to be between 75 to 90 atomic percent.

9. The method according to claim 7, wherein the thin layers of Ni and Fe are selected to be less than 10 Å thick.

10. The method according to claim 7, wherein a magneto-resistance changing ratio $\Delta\rho/\rho_0$ has a value exceeding 3% and a coercive force $H_{ch}$ of less than 1.0.

11. A method of manufacturing a magneto-resistance effect magnetic head comprising the steps of:

providing a base material for forming thereon a thin film for a magneto-resistance type magnetic head;

forming said thin film of Ni—Fe by sputtering Ni and Fe on said base material from an Ni target and a Fe target disposed separately while said Ni target and said Fe target and said base material are relatively rotated; and forming a unit layer of Ni—Fe alloy having a thickness less than 10 Å.

12. The method according to claim 11, wherein an amount of Ni in the composition of the whole magneto-resistance effect thin film is selected to be between 75 to 90 atomic percent.

13. The method according to claim 11, wherein the thin layers of Ni and Fe are selected to be less than 10 Å thick.

14. The method according to claim 11, wherein a magneto-resistance changing ratio $\Delta\rho/\rho_0$ has a value exceeding 3% and a coercive force $H_{ch}$ of less than 1.0.

* * * * *